United States Patent
Lin et al.

(10) Patent No.: US 9,276,613 B2
(45) Date of Patent: Mar. 1, 2016

(54) UNIVERSAL PACKET LOSS RECOVERY FOR DELIVERY OF REAL-TIME STREAMING MULTIMEDIA CONTENT OVER PACKET-SWITCHED NETWORKS

(76) Inventors: Shu Lin, Cerritos, CA (US); Harry Tan, Palos Verdes Estates, CA (US); Robert M. Liang, Irvine, CA (US)

(*) Notice: Subject to any disclaimer, the term of this patent is extended or adjusted under 35 U.S.C. 154(b) by 1031 days.

(21) Appl. No.: 13/344,384

(22) Filed: Jan. 5, 2012

(65) Prior Publication Data
US 2012/0110420 A1 May 3, 2012

Related U.S. Application Data

(63) Continuation of application No. 12/039,489, filed on Feb. 28, 2008, now Pat. No. 8,145,975.

(51) Int. Cl.
*H03M 13/29* (2006.01)
*H04L 1/00* (2006.01)

(52) U.S. Cl.
CPC ............ *H03M 13/29* (2013.01); *H03M 13/293* (2013.01); *H04L 1/0057* (2013.01); *H04L 2001/0093* (2013.01)

(58) Field of Classification Search
CPC .............. H03M 13/29; H03M 13/293; H04L 2001/0093; H04L 1/0057
USPC ......................................................... 714/755
See application file for complete search history.

(56) References Cited

U.S. PATENT DOCUMENTS

| | | | |
|---|---|---|---|
| 4,660,202 A * | 4/1987 | Woodsum ...................... | 714/804 |
| 4,670,881 A * | 6/1987 | Imoto ............................ | 714/755 |
| 4,785,451 A | 11/1988 | Sako et al. | |
| 4,975,915 A * | 12/1990 | Sako et al. ..................... | 714/755 |
| 5,159,452 A * | 10/1992 | Kinoshita et al. ............. | 348/466 |
| 5,224,106 A * | 6/1993 | Weng ............................ | 714/755 |
| 5,606,569 A | 2/1997 | MacDonald et al. | |
| 5,617,541 A * | 4/1997 | Albanese et al. ............. | 709/207 |
| 5,642,366 A | 6/1997 | Lee et al. | |
| 5,708,662 A * | 1/1998 | Takashima .................... | 370/496 |
| 5,734,780 A * | 3/1998 | Ichiura et al. ................. | 386/240 |
| 5,768,298 A * | 6/1998 | Nagai et al. ................... | 714/769 |
| 5,784,462 A * | 7/1998 | Tomida et al. ................ | 380/270 |

(Continued)

OTHER PUBLICATIONS

In the U.S. Appl. No. 12/039,489 Non-Final Office action dated Aug. 4, 2011, 8 pages.

(Continued)

*Primary Examiner* — Joseph D Torres

(57) ABSTRACT

The Universal Packet Loss Recovery System (UPLRS) is capable of recovering end-to-end network packet losses to obtain reliable end-to-end network delivery of multimedia streaming content over IP networks where packet losses appear above the transport layer. The UPLRS incorporates the use of Packet Forward Error Correction Coding (FEC) with packet interleaving processing prior to transport. Packet FEC is an error correction coding method at the packet level to improve link transmission reliability. At the source end of the packet-switching network, the Packet FEC scheme encodes a stream of transport multimedia content packets by including redundant packets in the stream to allow for the recovery of lost packets by the Packet FEC decoder at the user end of the packet-switching network. Since lost packets appear only above the transport layer in the IP network protocol stack, Packet FEC can be viewed as a transport layer or an application layer coding method.

9 Claims, 15 Drawing Sheets

(56) References Cited

U.S. PATENT DOCUMENTS

| | | | |
|---|---|---|---|
| 5,969,634 A * | 10/1999 | Takashima et al. | 340/7.34 |
| 5,995,517 A * | 11/1999 | Tomida et al. | 370/486 |
| 6,079,042 A * | 6/2000 | Vaman et al. | 714/755 |
| 6,122,764 A | 9/2000 | Kobayashi | |
| 6,145,109 A * | 11/2000 | Schuster et al. | 714/752 |
| 6,188,662 B1 * | 2/2001 | Maeda et al. | 369/83 |
| 6,226,769 B1 * | 5/2001 | Schuster et al. | 714/752 |
| 6,230,297 B1 | 5/2001 | Bentall et al. | |
| 6,317,462 B1 * | 11/2001 | Boyce | 375/240.27 |
| 6,367,047 B1 * | 4/2002 | McAuliffe et al. | 714/755 |
| 6,421,387 B1 * | 7/2002 | Rhee | 375/240.27 |
| 6,421,805 B1 * | 7/2002 | McAuliffe | 714/756 |
| 6,516,435 B1 * | 2/2003 | Tsunoda | 714/751 |
| 6,615,387 B1 | 9/2003 | Williamson et al. | |
| 6,681,362 B1 * | 1/2004 | Abbott et al. | 714/755 |
| 6,697,996 B2 * | 2/2004 | Chethik | 714/804 |
| 6,745,364 B2 * | 6/2004 | Bhatt et al. | 714/774 |
| 6,963,589 B1 | 11/2005 | Sugata et al. | |
| 7,017,102 B1 | 3/2006 | Kristensson et al. | |
| 7,080,278 B1 * | 7/2006 | Kleiman et al. | 714/6.24 |
| 7,149,947 B1 | 12/2006 | MacLellan et al. | |
| 7,188,295 B2 | 3/2007 | Van Dijk et al. | |
| 7,191,379 B2 | 3/2007 | Adelmann et al. | |
| 7,228,485 B1 | 6/2007 | Wu et al. | |
| 7,283,966 B2 | 10/2007 | Zhang et al. | |
| 7,296,209 B2 | 11/2007 | Katayama et al. | |
| 7,409,627 B2 * | 8/2008 | Kim et al. | 714/776 |
| 7,447,977 B2 * | 11/2008 | Bauer et al. | 714/774 |
| 7,516,389 B2 * | 4/2009 | Song | 714/755 |
| 7,539,928 B2 | 5/2009 | Rhee et al. | |
| 7,617,434 B1 * | 11/2009 | Huang | 714/755 |
| 7,716,559 B2 * | 5/2010 | Champel | 714/776 |
| 7,751,324 B2 * | 7/2010 | Vadakital et al. | 370/231 |
| 7,831,885 B2 | 11/2010 | Choi et al. | |
| 7,904,791 B2 | 3/2011 | Hwang et al. | |
| 7,979,776 B2 | 7/2011 | Hwang et al. | |
| 8,103,933 B2 * | 1/2012 | Fislage | 714/758 |
| 8,804,761 B2 * | 8/2014 | Grilli et al. | 370/469 |
| 2001/0018343 A1 * | 8/2001 | Nakata | 455/426 |
| 2003/0229840 A1 * | 12/2003 | Pattavina | 714/776 |
| 2005/0193312 A1 * | 9/2005 | Smith et al. | 714/755 |
| 2009/0129516 A1 | 5/2009 | Chang et al. | |

OTHER PUBLICATIONS

Reed-Solomon error correction; http://en.wikipedia.org/wiki/Reed%E2%80%93Solomon_error_correction; Jul. 26, 2011; pp. 1-15.

* cited by examiner $$M = \begin{bmatrix} P_1(1) & P_2(1) & \cdots & P_L(1) & \cdots & P_1(K+1) & P_2(K+1) & \cdots & P_L(K+1) & \cdots & P_1((n-2)K+1) & P_2((n-2)K+1) & \cdots & P_L((n-2)K+1) \\ P_1(2) & P_2(2) & \cdots & P_L(2) & \cdots & P_1(K+2) & P_2(K+2) & \cdots & P_L(K+2) & \cdots & P_1((n-2)K+2) & P_2((n-2)K+2) & \cdots & P_L((n-2)K+2) \\ P_1(3) & P_2(3) & \cdots & P_L(3) & \cdots & P_1(K+3) & P_2(K+3) & \cdots & P_L(K+3) & \cdots & P_1((n-2)K+3) & P_2((n-2)K+3) & \cdots & P_L((n-2)K+3) \\ \vdots & \vdots & & \vdots & & \vdots & \vdots & & \vdots & & \vdots & \vdots & & \vdots \\ P_1(K) & P_2(K) & \cdots & P_L(K) & \cdots & P_1(2K) & P_2(2K) & \cdots & P_L(2K) & \cdots & P_1((n-1)K) & P_2((n-1)K) & \cdots & P_L((n-1)K) \end{bmatrix}$$

$$\underbrace{\phantom{P_1(1) \; P_2(1) \; \cdots \; P_L(1)}}_{D(1)} \quad \underbrace{\phantom{P_1(K+1) \; P_2(K+1) \; \cdots \; P_L(K+1)}}_{D(2)} \quad \underbrace{\phantom{P_1((n-2)K+1) \; P_2((n-2)K+1) \; \cdots \; P_L((n-2)K+1)}}_{D((n-1))}$$

FIG. 13

UNIVERSAL PACKET LOSS RECOVERY FOR DELIVERY OF REAL-TIME STREAMING MULTIMEDIA CONTENT OVER PACKET-SWITCHED NETWORKS

CROSS-REFERENCE TO RELATED APPLICATION

This application is a continuation of U.S. patent application Ser. No. 12/039,489 filed Feb. 28, 2008.

FIELD OF THE INVENTION

This invention relates to data transmission networks and to a system that is capable of recovering end-to-end network packet losses.

BACKGROUND OF THE INVENTION

It is a problem in the field of data transmission that the rapid growth of the Internet and the transition of all multimedia content to digital formats have resulted in the use of packet-switched networks for the delivery of all video and audio content. Examples of such information delivery include, but are not limited to, delivery of voice services and music and television entertainment over all forms of broadband data access networks including: satellite, cable, DSL, and cellular telephone networks using Internet Protocol (IP) based technology. The distribution of streaming media content over the Internet is simple in concept: the streaming media content is packetized into transport packets that are delivered from the content server to the user across the network as long as there is a persistent Internet Protocol connectivity between them.

The fundamental problem with this form of information delivery is that the Internet Protocol networks are not suited to support reliable delivery of continuous streams of data, since this network architecture is an economical "best efforts" packet delivery platform. For example, packets are discarded or dropped when the routers at the switching nodes in an Internet Protocol network cannot handle the traffic congestion caused by a surge in network traffic. Packet loss, which is an inherent property of the "best effort" nature of Internet Protocol networks, can cause serious degradations in streaming video quality.

The public Internet is an interconnection of packet-switched data communication networks, composed of a hybrid combination of various terrestrial wire-line and wireless transmission links, as well as satellite links. The Internet is poised to provide Internet Protocol connectivity for the delivery of many varieties of multimedia services and, in particular, video streaming services. High-quality efficient video streaming transmission services are critical enablers for a variety of existing and emerging applications, such as Internet Protocol videoconferencing, live video entertainment, as well as on-demand video entertainment, including: Internet Protocol Television (IPTV), interactive gaming, telemedicine, remote teaching and training, and remote video surveillance. The delivery of streaming multimedia over the Internet combines regular audio and video content along with the synthetic multimedia content of virtual reality and the integrated imagery and graphics of web content to form a real-time interactive rich media event. The streaming multimedia content is delivered from the content source to the user in real-time. Live or pre-recorded content can be streamed according to a schedule and pushed from the content server to the user. Similarly, if the content has been stored for on-demand delivery, a streaming server delivers it at a controlled rate in real-time when the user requests and pulls down the content from the streaming server. This is in direct contrast to the legacy download-and-play process utilized to deliver streamed content in the early days of the Internet.

End-to-end streaming video quality can be impaired by packet losses either caused by dropped packets at routers due to network congestion or by corrupted packets over transmission links with excessive link noise or wireless propagation degradations (collectively termed "corrupted packets" herein). Streaming video is often acutely sensitive to even very low levels of packet loss. When interframe coding is used in video compression for delivery of digital TV, artifacts such as dropout, tiling, or pixelization caused by packet losses appearing in a reference video frame can impact all the frames within the reference frame picture group, which typically lasts between half a second to one second in duration. During channel change, compression decoders must wait until the next reference frame is assembled before presenting the new channel content to the user. Packet losses appearing in this frame can cause the decoder to have to wait until the next good reference frame, thus significantly increasing the TV channel change time.

Error control procedures can be applied at different layers of the Internet Protocol network protocol stack to handle packet losses. At the link level, Forward Error Correction Coding (FEC) can be employed in the Physical (PHY) layer to correct for bit errors in received packets caused by link impairments such as wireless channel noise and multi-path fading effects. In this approach, each packet is individually encoded with the Forward Error Correction Code to include some additional redundant bits that are transmitted along with the data bits. These redundant bits enable the decoder for the Forward Error Correction Code, which is located at the receiver, to correct for a number of bit errors in each packet within the error correction capability of the error correction code. Since Internet Protocol packets are discarded at the transport layer if its checksum fails (such as for packets with uncorrectable bit errors after the decoding process for the physical level Forward Error Correction Coding scheme is completed), only missing or lost packets can occur over the end-to-end network above the transport layer and up to the application layer.

Internet Protocol technology ensures end-to-end network packet delivery reliability through a scheme called Transmission Control Protocol (TCP) where missing or lost packets are retransmitted. Since real-time video streaming is an extremely delay sensitive service, end-to-end retransmission methods such as that used in TCP are generally not feasible except for direct transport over small local area networks with very short propagation delays. Instead, User Datagram Protocol (UDP) or Real Time Protocol (RTP) is commonly used in transporting real-time video streaming over Internet Protocol networks. Moreover, retransmission methods such as TCP do not scale for multicast applications involving large user groups. Many Internet Protocol Television service providers have turned recently to the use of managed Internet Protocol networks in an attempt to address this packet loss issue. Managed networks prioritize real-time traffic, such as the video streaming packets, so that superior routing treatment is given to them. This can reduce the packet loss rate for streaming traffic. However the reduced level of packet loss rate still cannot ensure an end-to-end streaming video quality which matches that expected by legacy TV broadcast subscribers, let alone the more stringent quality of viewing experience expectations for High Definition TV.

BRIEF SUMMARY OF THE INVENTION

The above-described problems are solved and a technical advance achieved by the present Universal Packet Loss Recovery System For Delivery of Real-Time Streaming Multimedia Content Over Packet-Switched Networks (termed "Universal Packet Loss Recovery System" herein) which is capable of recovering end-to-end network packet losses. It is designed primarily to obtain reliable end-to-end network delivery of streaming multimedia content (including, but not limited to, video content) over Internet Protocol networks, where packet losses appear above the transport layer. This Universal Packet Loss Recovery System incorporates the use of Packet Forward Error Correction Coding (FEC) along with packet interleaving processing prior to transport. Packet Forward Error Correction Coding is an error correction coding method at the packet level, rather than the bit level Forward Error Correction Coding commonly employed in the physical layer, to improve link transmission reliability. At the video source end of the packet-switching network, the Packet Forward Error Correction Coding scheme encodes a stream of multimedia content transport packets by including redundant packets in the stream to allow for the recovery of lost packets by the decoder of the Packet Forward Error Correction Coding scheme that is located at the user end of the packet-switching network. Since lost packets appear only above the transport layer in the Internet Protocol network protocol stack, Packet Forward Error Correction Coding can be viewed as either a transport layer or as an application layer coding method.

The packet interleaving process creates an architectural flexibility that allows for many different modes of packet encoding and transport that can be adjusted and adapted to provide various degrees of network bandwidth efficiency and packet loss recovery capabilities, as well as packet processing requirements. This Universal Packet Loss Recovery scheme has the following features:

1. Video streaming applications have different packet loss recovery requirements ranging from the stringent one in a million end-to-end packet loss rate required for Internet Protocol television to the much less stringent requirements for cell phone thumbnail size video. The Universal Packet Loss Recovery System has scalable packet loss recovery capability and has scalable bandwidth efficiency that is universally adaptable to all streaming multimedia applications.
2. The packet loss recovery processing at the user end in the Universal Packet Loss Recovery System does not require any interactions with the source end during this processing Hence, it is suitable for all multicast streaming multimedia applications.
3. Various Packet Forward Error Correction Coding architectures can be employed by the Universal Packet Loss Recovery System to address specific Internet Protocol packet loss patterns.
4. The Universal Packet Loss Recovery System is universally network medium agnostic and can be used for any packet-switched transport network. It is applicable not only to Internet Protocol networks in this regard, but can also be used for Ethernet, Asynchronous Transfer Mode (ATM), and Multiprotocol Label Switching (MPLS) networks, as well as in legacy Time Division Multiplexed (TDM) and Synchronous Optical Network (SONET) framing of packet data. The Universal Packet Loss Recovery System can be used also in Wireless Fidelity (WiFi), Worldwide Interoperability for Microwave Access (WIMAX), and Third Generation (3G) cellular networks, as well as satellite networks.
5. In video streaming applications, the Universal Packet Loss Recovery System is agnostic to both compressed and uncompressed video content and does not interfere with content security mechanisms.
6. Both software and hardware implementations of the Universal Packet Loss Recovery System can be developed.

This Universal Packet Loss Recovery System has many diverse applications categorized by the different network source-user endpoints where the encoding and decoding operations of the Packet Forward Error Correction Coding scheme are carried out.

BRIEF DESCRIPTION OF THE DRAWINGS

FIG. 13 illustrates the encoding of data packets using a third method of the present Universal Packet Loss Recovery System;

DETAILED DESCRIPTION OF THE INVENTION

Figure 1:
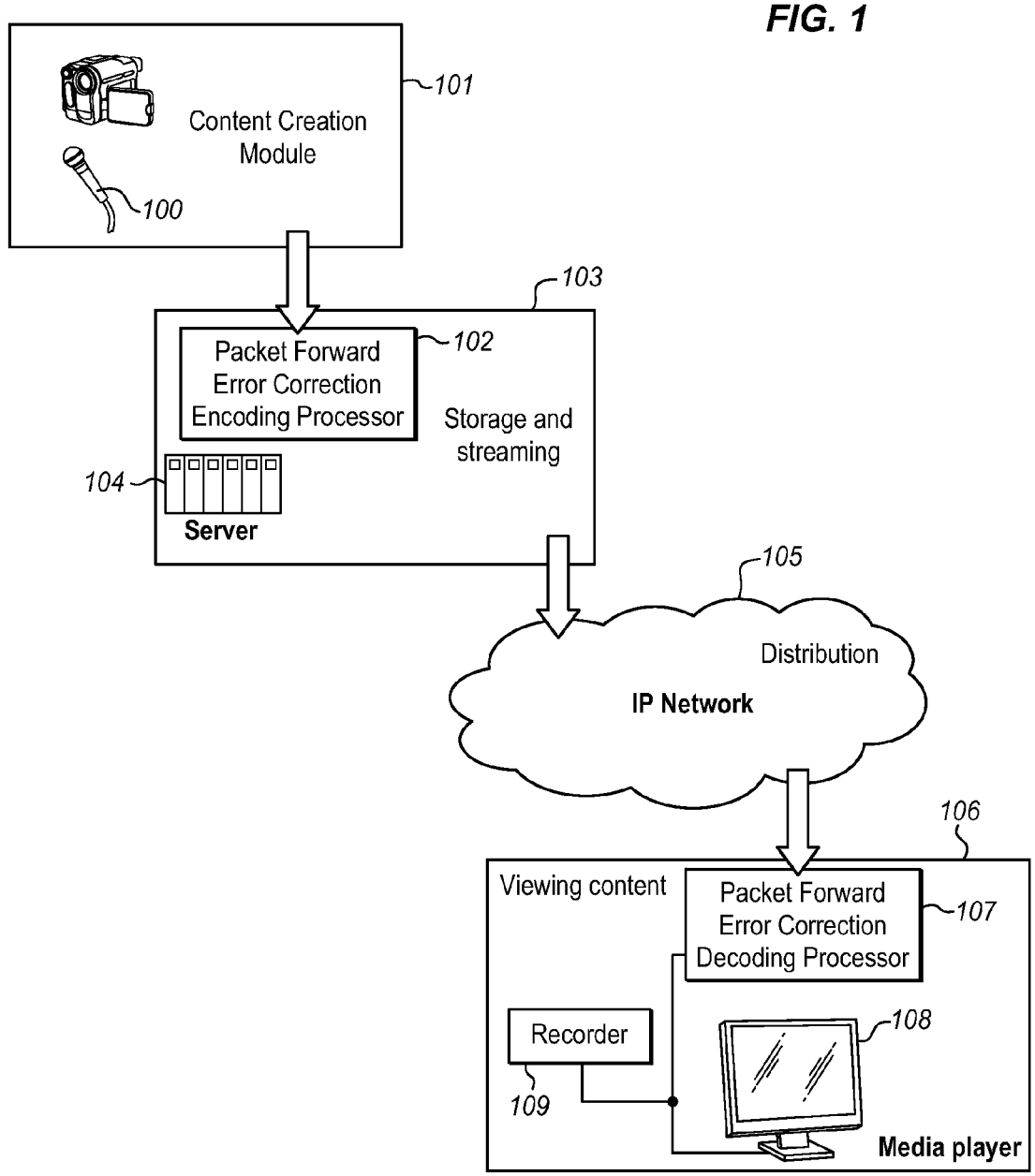
FIG. 1 illustrates, in block diagram form, a typical data communication network in which the present Universal Packet Loss Recovery System is implemented.

FIG. 1 illustrates, in block diagram form, a typical data communication network in which the present Universal Packet Loss Recovery System is implemented. The encoding processing 102 of the Packet Forward Error Correction Coding scheme is carried out at the streaming server end 103, and the decoding processing 107 of the Packet Forward Error Correction Coding scheme is carried out at the media player end 106. In particular, the multimedia content from sources 100 in the content creation module 101 is delivered to the storage and streaming module 103, where server(s) 104 manage the distribution and delivery of the encoded content to the users via the Internet Protocol network 105. The user site 106 includes a decoder 107 which converts the encoded content received from server 104 into the reconstituted multimedia content for display by media player 108 or storage on a media recorder 109 for later viewing by the user. This architecture is simply exemplary of a typical environment and may be modified in numerous ways without departing from the scope and intent of the present Universal Packet Loss Recovery System.

Figure 2:
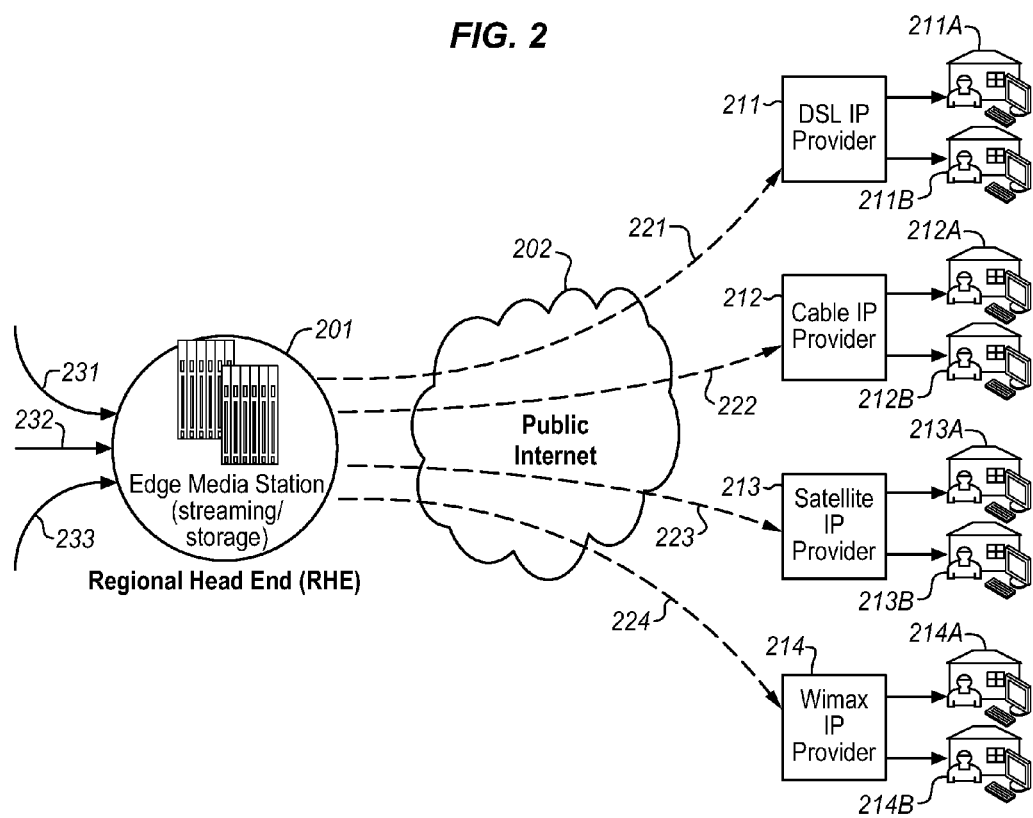
FIG. 2 illustrates the network architecture used to deliver Internet Protocol television to a plurality of subscribers via various transmission mediums.

The ubiquity of the Internet and its lower distribution costs make web access to TV programming the lowest cost mass consumer distribution channel. As shown in FIG. 2, this network architecture can be used to deliver Internet Protocol television to a plurality of subscribers via various transmission mediums. This may be an un-managed network with a high end-to-end packet loss rate. The various content streams 231-233, comprising multimedia data, are delivered to Regional Head End 201, where they are converted into a plurality of user content streams 221-224 for web-access based delivery to identified users 211A-214B via the Internet 202. The user content streams 221-224 are shown as being directed to a plurality of Internet service providers: DSL IP Provider 211, Cable IP Provider 212, Satellite IP Provider 213, and WiMAX IP Provider 214. Each of these Internet service providers 211-214 serves a corresponding plurality of users 211A-211B, 212A-212B, 213A-213B, and 214A-214B, respectively.

Figure 3:
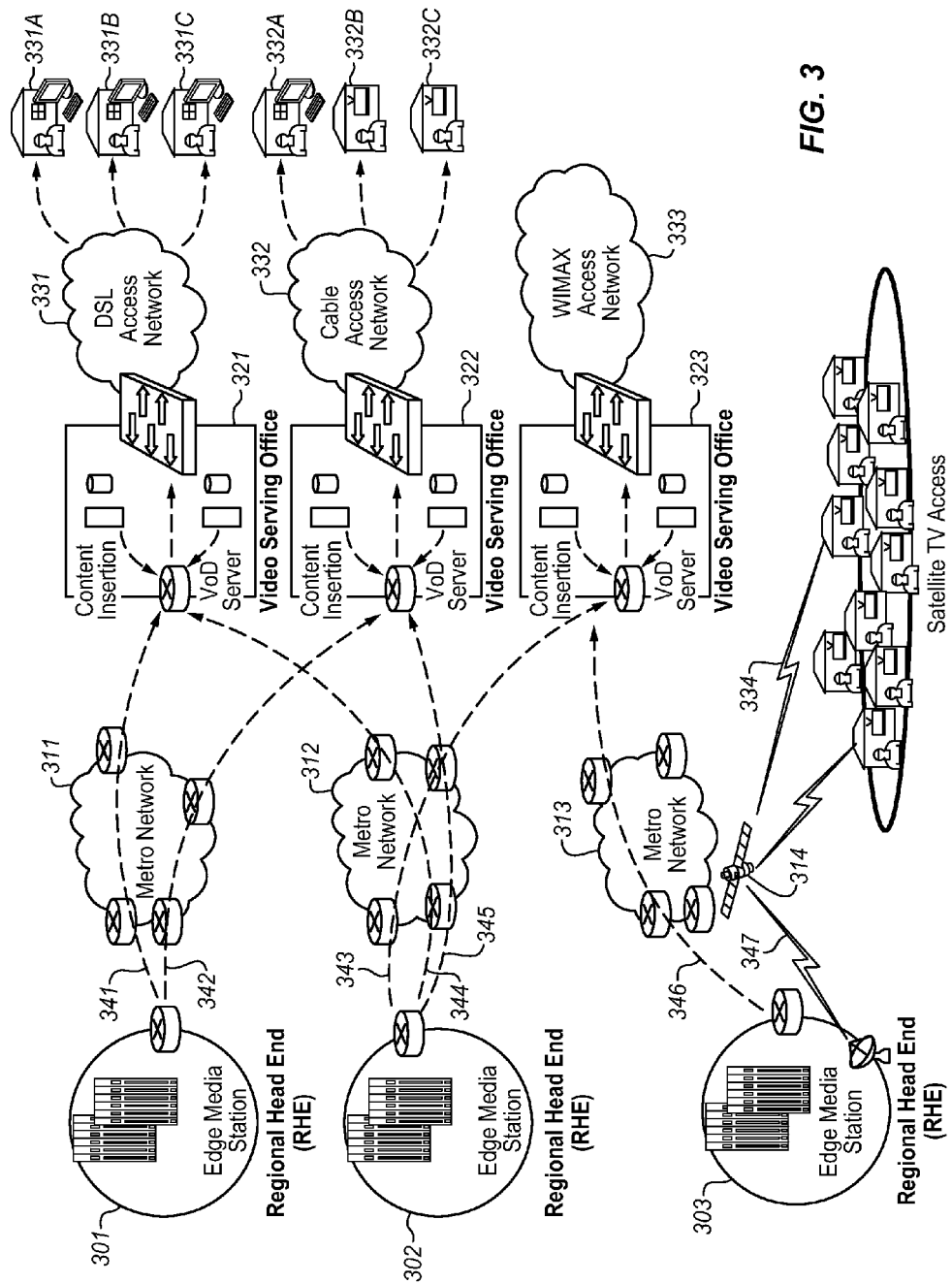
FIG. 3 illustrates the network architecture used to deliver Internet Protocol television to a plurality of subscribers via a broadband network medium.

Telecom providers are eager to offer Video On Demand and Scheduled TV Services using DSL access, while cable and satellite TV operators are battling them by offering voice services over their video networks. Services can be broadcast or narrowcast. The most economical approach in both cases lies in a converged Internet Protocol network solution as shown in FIG. 3. The various content streams (not shown), comprising multimedia data, are delivered to Regional Head Ends 301-303, where they are converted into a plurality of user content streams 341-347 for delivery to identified users 331A-332C via corresponding Internet Protocol Metro networks 311-313 or satellite links 314. The user content streams 341-347 are shown as being directed to a plurality of video serving offices 321-323 and then to local access networks: DSL Access Network 331, Cable Access Network 332, WiMAX Access Network 333, and Satellite TV Access Network 334. Each of these Access Networks 321-333 serves a corresponding plurality of users 331A-331C and 332A-332C, respectively.

Figure 4:
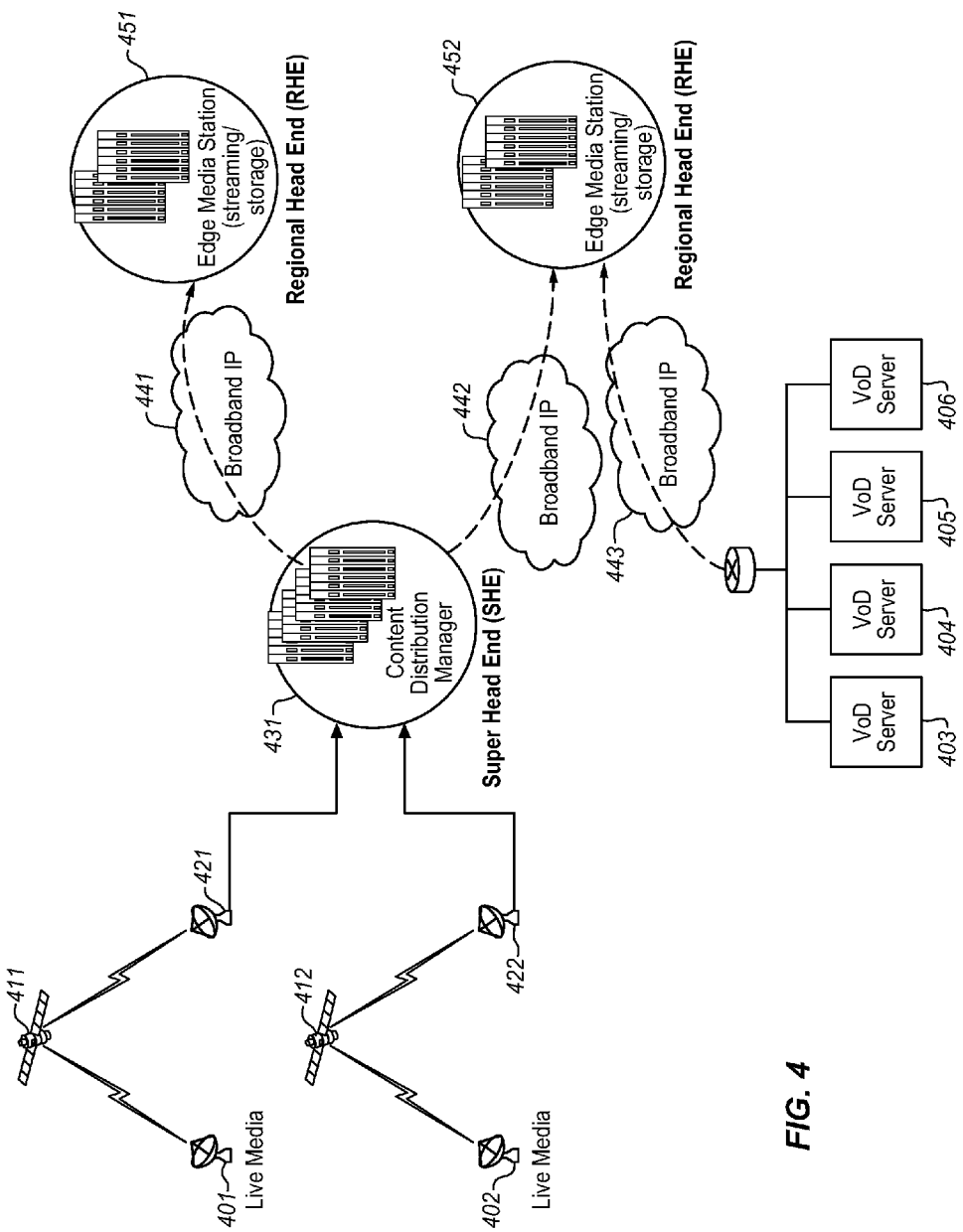
FIG. 4 illustrates the network architecture used to deliver video content to a plurality of head end locations via a broadband network medium.

Content producers and distributors also may find it more economical to base new contribution and distribution networks on Internet Protocol technology as shown in FIG. 4. Distributed architectures can put a majority of the video processing in the Super Head End (SHE) 431. The Super Head End 431 receives live multimedia content from content sources 401, 402 as delivered via satellites 411, 412 and ground stations 421, 422 (or other transmission mediums). The Super Head End 431 generates video packet streams transported over Internet Protocol networks 441, 442 to Regional Head Ends (RHE) 451, 452. The Regional Head End 451, 452 can customize video local channel services for delivery via local distribution networks as shown in FIGS. 2 and 3. This requires head end consolidation, transcoding, multiplexing, and local content and ad insertion. Therefore, all received content streams have to be recovered at Regional Head Ends. The Regional Head Ends 452 can also receive multimedia content from Video On Demand Servers 403-406 as the content sources.

Figure 5:
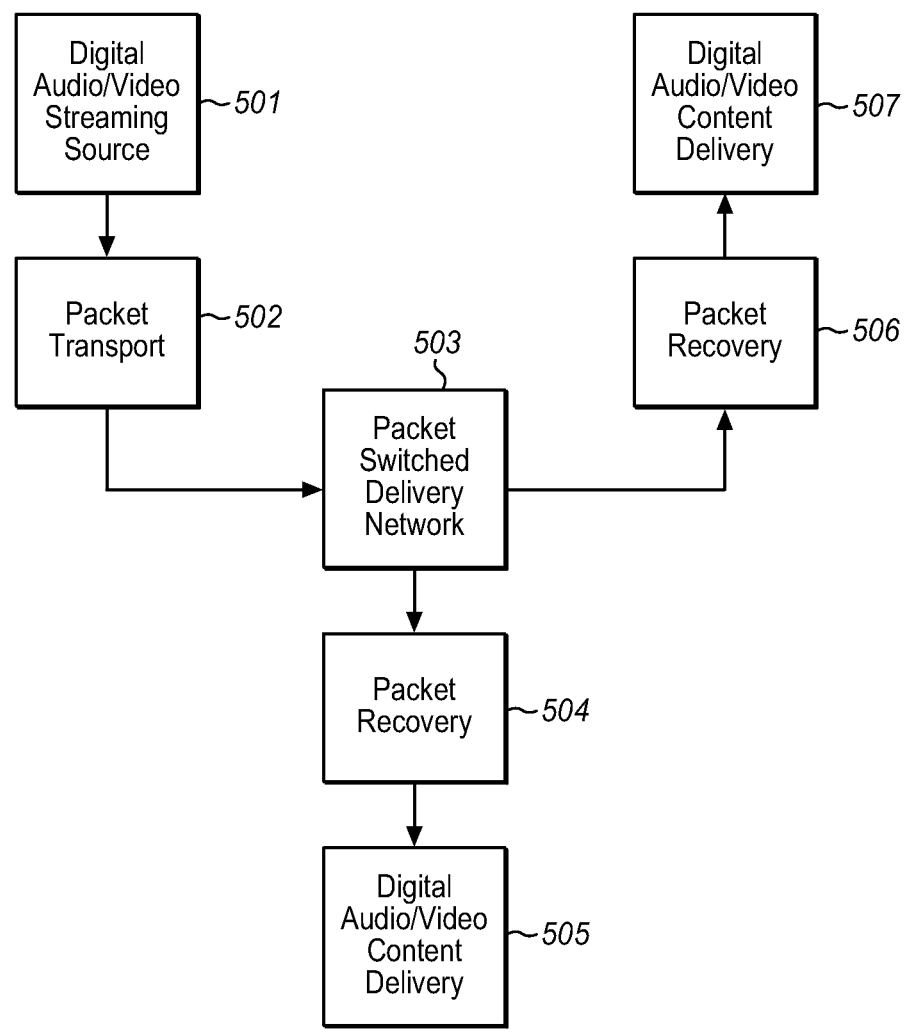
FIG. 5 illustrates, in block diagram form, the present Universal Packet Loss Recovery System as applied to a representative Internet Protocol audio/video streaming application with a single source and two end users.

FIG. 5 illustrates, in block diagram form, the present Universal Packet Loss Recovery System as applied to an overview of a representative Internet Protocol audio/video streaming application with a single source 501 and two end users 505, 507 where the Universal Packet Loss Recovery system is employed. The encoder processing for the Packet Forward Error Correction Coding scheme can be performed either at the streaming source 501 or at the packet transport 502, and the decoder processing for the Packet Forward Error Correction Coding scheme can be performed at the packet recovery blocks 504, 506. As described below, the encoder operation for the Packet Forward Error Correction Coding scheme can include the packet interleaving processing. Moreover, the corresponding de-interleaving processing can be included in the decoder operation of the Packet Forward Error Correction Coding scheme. This Universal Packet Loss Recovery method has three different architectures with diverse performance and implementation characteristics that are described below.

The packet interleaving approach is described below in terms of packet arrays that are subsequently encoded and then transmitted in various ways to obtain certain performance objectives. In each of the three methods described below, the transport data packets that are encoded in the Packet Forward Error Correction Coding scheme are all assumed to be of a fixed constant length with a packet header and a data payload. Since this is a packet-switched network, where it is likely to include routing and switching information in the header that is used at the network nodes, only the data payload is encoded in this Packet Forward Error Correction Coding scheme. Hence, the following descriptions of the encoding and decoding processes for the Packet Forward Error Correction Coding schemes consider only the data payloads, since packet headers are not processed.

Figure 6:
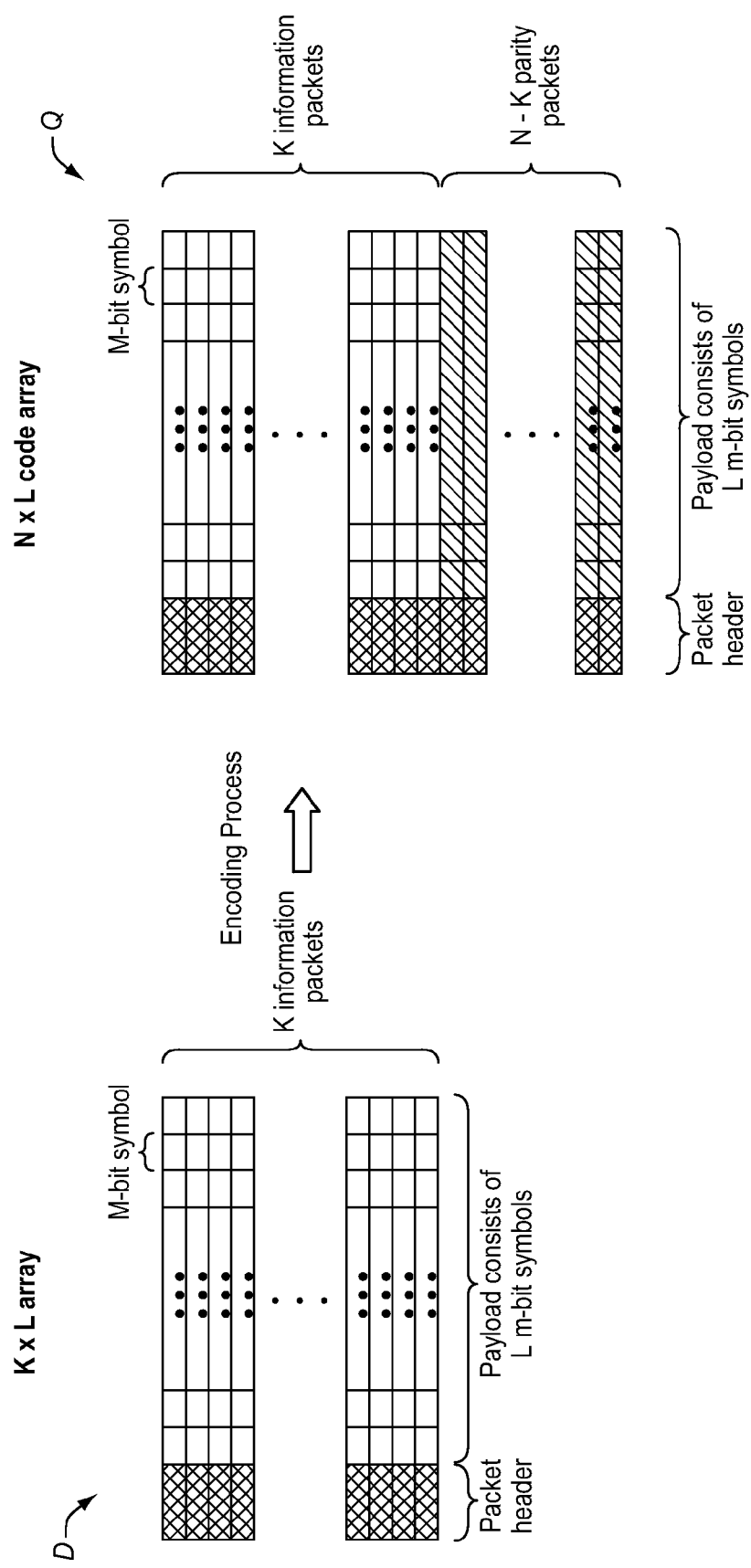
FIG. 6 illustrates the implementation of a first method of the present Universal Packet Loss Recovery System to encode data packets.

Method 1: Column Packet Array Encoded Using a Single Maximum Distance Separable Forward Error Correction Code Consider the case where the data payload in each transport data packet consists of L m-bit bytes. Each m-bit byte is regarded as a symbol in the Galois field $GF(2m)$. Before transmission, the data payload portions of the K data packets are stored in a buffer as rows of a K×L array D over $GF(2m)$. Each column of array D consists of K symbols in $GF(2m)$ as shown in FIG. 6. Note that FIG. 6 depicts the array D along with the headers of each of the packets in D.

The Packet Forward Error Correction Coding method used by the Universal Packet Loss Recovery System employs an (N, K) error correction code C consisting of K codewords, each being a vector of N symbols from the Galois field $GF(2m)$. Assume that the error correction code C is a systematic Maximum Distance Separable (MDS) code. Such an error correction code has the theoretical capability of recovering up to N−K lost symbols or erasures (the actual erasure loss recovery capability may be less than N−K, depending on the type of erasure decoding algorithm used at the receiving end). Examples of such error correction codes are the Reed Solomon (RS) codes and the shortened Reed Solomon codes. Using this error correction code C, each data payload column of array D is encoded into a codeword in the error correction code C. This encoding process results in an N×L array Q for which the first K rows are data packets and the last N−K rows are parity packets. The array Q, as shown in FIG. 6, is called the encoded packet data payload array. Note that FIG. 6 depicts the array Q along with the headers of each of the packets in Q. This encoded array then is transmitted row by row from the encoder output to the users. Hence, the error correction code C is interleaved between the transmitted packet data payload symbols.

Figure 7:
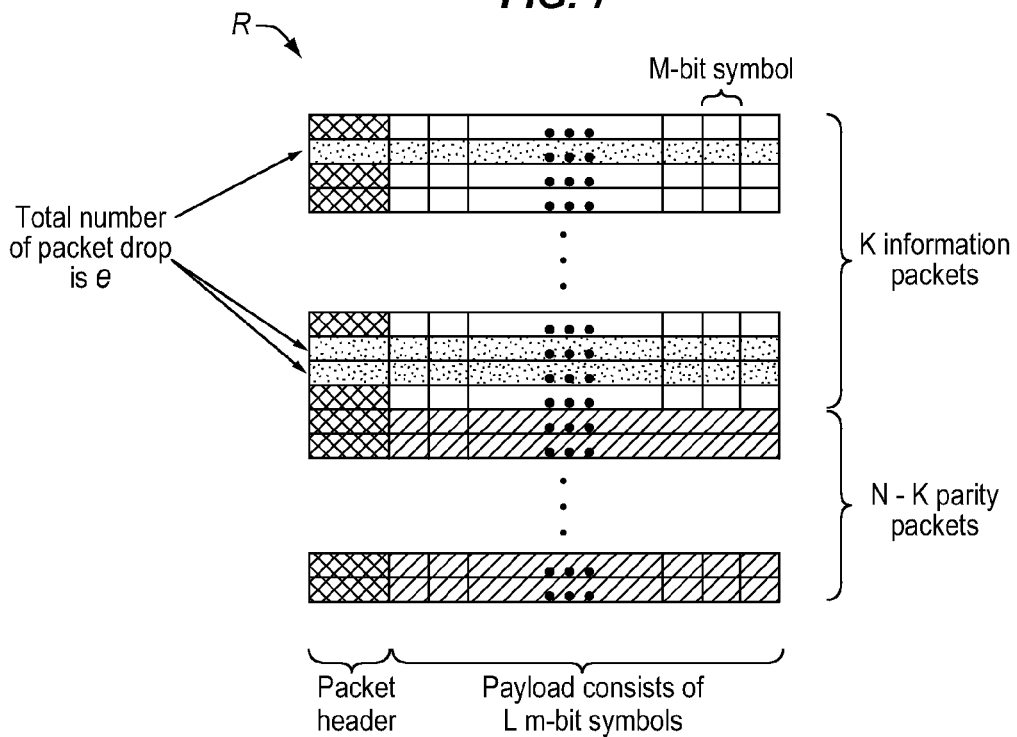
FIG. 7 illustrates the implementation of a first method of the present Universal Packet Loss Recovery System illustrating the format of the received encoded data packets.

As shown in FIG. 7, at the receiving end, each received packet is regarded as being error-free, and each lost packet is regarded as consisting of L erased symbols. When a packet is received, its data payload is stored as a row of L symbols in a receive buffer for the decoding process. However, when a lost packet is detected, a null packet consisting of a row of L empty slots appears in the receive buffer, where each empty slot corresponds to a transmitted symbol being lost during the transmission. If no data packets are lost at the end of the K data packet time duration, the K stored packets in the receive buffer are then delivered to the end user and the next N−K parity packets are discarded as they arrive. If there are lost data packets within the K data packet time duration, then the data payload portion of the N−K parity packets are stored in the receive buffer as they arrive. When the receive buffer is filled with N received or null packets, it consists of an N×L array R of correctly received and erased symbols in GF(2m). If there are e lost packets, then each column of R contains e erased symbols, as shown in FIG. 7. Note that FIG. 7 depicts the array R along with the headers of each of the packets in R.

The data payload area of the received array R is decoded column by column using an erasure decoding algorithm for the (N,K) error correction code C. For example, if a Reed Solomon code is used with a Berlekamp-Massey algorithm erasure decoder, the erasure decoding capability is then equal to (N−K)/2 symbols per column. If e is less than or equal to the error correction code C erasure decoder's erasure correction capability, then the erased symbols in each column of array R are recovered perfectly. The correctly received and recovered data packets are then delivered to the end user. If e is greater than the erasure correction capability of this decoder, a decoding failure is declared and (K−e) packets are delivered to the user and the N−K parity packets are discarded.

Figure 8:
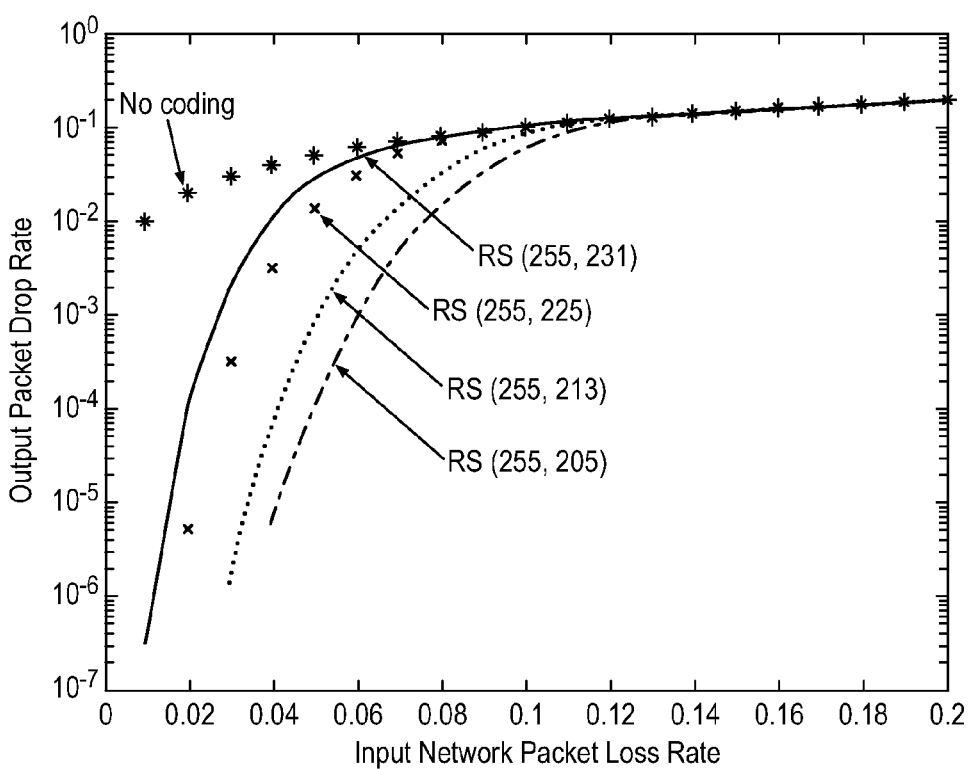
FIG. 8 illustrates simulation results for decoded packet loss rates for various codes of a first method of the present Universal Packet Loss Recovery System.

The decoded packet loss rate performance of Method 1 for a memory-less network packet loss model was simulated using Reed Solomon or shortened Reed Solomon codes and a Berlekamp-Massey decoding algorithm for N=255 and various values of K. FIG. 8 shows some of these results. It can be seen that the decoded packet loss rate improves as the code bandwidth expansion factor (which is defined here to be equal to (N−K)/K) increases. Simulation results indicate that the commonly accepted end-to-end packet loss rate standard of 10−6 for broadcast Internet Protocol TV can be met for input packet loss rates of up to 10% in this scheme with reasonably small bandwidth expansion factors. A Universal Packet Forward Error Correction Coding scheme with a single encoder and decoder implementing a variety of Reed Solomon codes with different bandwidth expansion factors and associated decoded packet loss rate performance capabilities is important to provide performance and implementation flexibility for the delivery of multimedia streaming applications over Internet Protocol networks. Such an implementation with Reed Solomon codes requires encoders and decoders with programmable generator polynomials. Software implementations are achievable while hardware implementations may require a high level of complexity. The resulting Packet Forward Error Correction Coding schemes then can be used to obtain corresponding Universal Packet Loss Recovery Systems.

Method 2: Column Packet Arrays With Multiple Frames Encoded Using A Single Parity Check Code Followed By Encoding Using A Maximum Distance Separable Forward Error Correction Code The objective of this method is to provide a Universal Packet Forward Error Correction Coding scheme with a variety of bandwidth expansion factors and decoded packet loss rate performance capabilities using a simpler approach than that of Method 1. In particular, the objective is a simpler method for obtaining a Universal Packet Forward Error Correction Coding architecture.

Again, we consider the case where the data payload in each packet consists of L symbols from the field GF(2m). Method 2 makes use of two error correction codes C(1) and C(2). The error correction code C(2) is an (N,K) Maximum Distance Separable code over the Galois field GF(2m) similar to the error correction code C in Method 1. The error correction code C(1) is an (n, n−1) linear block code over GF(2m) which generates a single parity check symbol obtained by adding (n−1) data symbols over this field. Therefore, C(1) is a single parity check code. These codes will be used together where K=k(n−1).

Figure 9:
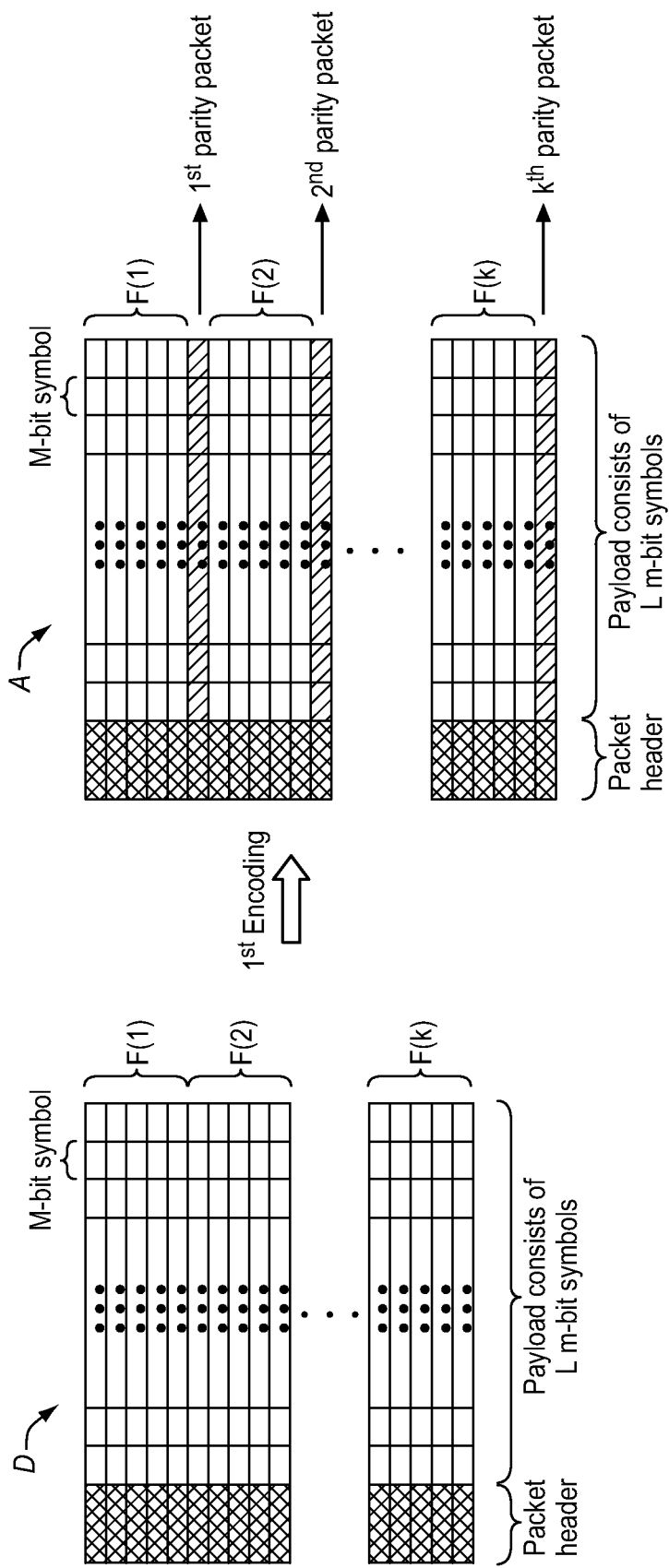
FIG. 9 illustrates the implementation of a first stage of a second method of the present Universal Packet Loss Recovery System to encode data packets.

Encoding consists of two stages. In the first stage, incoming data packets are divided into blocks, each block consisting of K=k(n−1) consecutive packets. Each block of K=k(n−1) packets is then subdivided into k consecutive frames, with each frame consisting of (n−1) packets. These frames are denoted by F(1), F(2), ... F(k). The data payload contained in these k frames, each of which consists of (n−1) packets, are then stored in a buffer that can be represented as a K×L array over GF(2m), as shown in FIG. 9. Furthermore, each frame F(i) can be represented by an (n−1)×L matrix D(i) over GF(2m). The first stage of encoding uses the single parity check code C(1). In this process, each data payload column of the (n−1)×L matrix D(i) is encoded into a codeword in the single parity check code C(1). This encoding of each data payload column of D(i) results in a row of L parity-check symbols which forms a single parity packet for the (n−1) data packets of the i-th frame F(i). The first stage of the encoding process is completed after D(1), D(2) ... D(k) are all encoded in this manner. This results in the kn×L encoded packet array A over GF(2m) as shown in FIG. 9. This array consists of kn L-symbol packets where k(n−1) of them are data packets and k of them are parity packets. Each column of the array A then contains k(n−1) data symbols and k parity-check symbols over GF(2m). Note that FIG. 9 depicts the arrays D and A along with the respective headers of each of the packets in D and in A.

Figure 10:
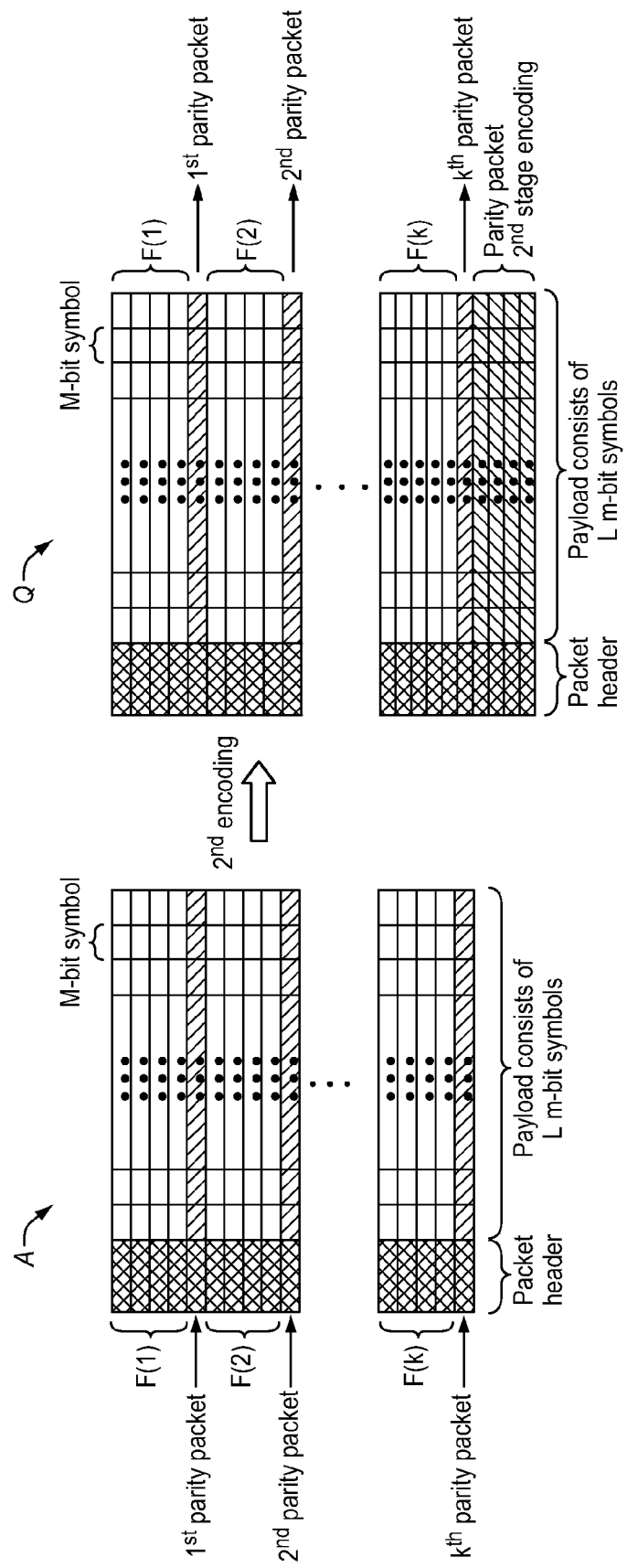
FIG. 10 illustrates the implementation of a second stage of a second method of the present Universal Packet Loss Recovery System to encode data packets.

The (N,K) error correction code C(2), where K=k(n−1), is used in the second stage of encoding. In this process, the K=k(n−1) data symbols in each data payload column of A is encoded into a codeword in the error correction code C(2). This second stage of encoding (which is similar to the encoding process employed in Method 1 using the error correction code C) results in an (N+k)×L encoded packet array Q over GF(2m) as shown in FIG. 10. The first (K+k) rows of Q are the first stage encoded packet array A, and the last N−K rows of Q are parity packets obtained using the code C(2). Note that FIG. 10 depicts the arrays A and Q along with the respective headers of each of the packets in A and in Q. This encoded array Q then is transmitted row by row.

The single parity check code C(1) in this Method 2 is intended for the purpose of correcting single packet losses that may appear in transmission of one of the frames in the encoded packet array across the network. This then is intended to reduce the packet loss recovery required to be performed by the more complex decoding process used to decode the error correction code C(2). It also serves to reserve the packet loss recovery capability of the error correction code C(2) for bursty rather than isolated losses. Therefore, the decoding process also consists of two stages. In the first decoding stage, the single parity erasure decoder for the single parity check code C(1) is used in each of the received frames. The second stage then employs an erasure decoder for the error correction code C(2) similar to that used in Method 1 for decoding the error correction code C.

The decoding process then proceeds as follows. Each block of (N+k) received packets forms a received block. The first kn received packets in a received block are divided into k received frames, denoted as R(1), R(2), ..., R(k). The n received packets of the i-th received frame R(i) are stored in a receive buffer as they arrive. The received frame R(i) then is represented as an (n×L) matrix M(i) where a lost packet is represented by a row of erasure symbols (or erasures). The N packets of a received block then can be represented as an (N+k)×L matrix M of symbols from GF(2m) and/or erasures.

If a received frame R(i) contains only one lost packet, then the erased symbol in each data payload column of M(i) can be recovered perfectly using erasure decoding for the (n, n−1) single parity check code C(1). Therefore, the first stage of decoding decodes only those frames R(i) which have a single lost packet and recovers all these single packet losses. If all the lost packets in the k received frames R(1), ..., R(k) are recovered at the first stage of decoding, then all the k(n−1) data packets are delivered to the end user. Otherwise, there are still rows of erasure symbols in the data payload area of M, and so each column of M still contains erasure symbols after the first stage of decoding. The second stage of decoding then is performed. The rows of k parity-check symbols/erasures in each received frame are first removed from M. This results in an N×L array of symbols from GF(2m) and/or erasures. Each data payload column of this array then is decoded using the erasure decoding algorithm of the error correction code C(2). This process is identical to that employed in Method 1 for decoding the error correction code C.

Figure 11:
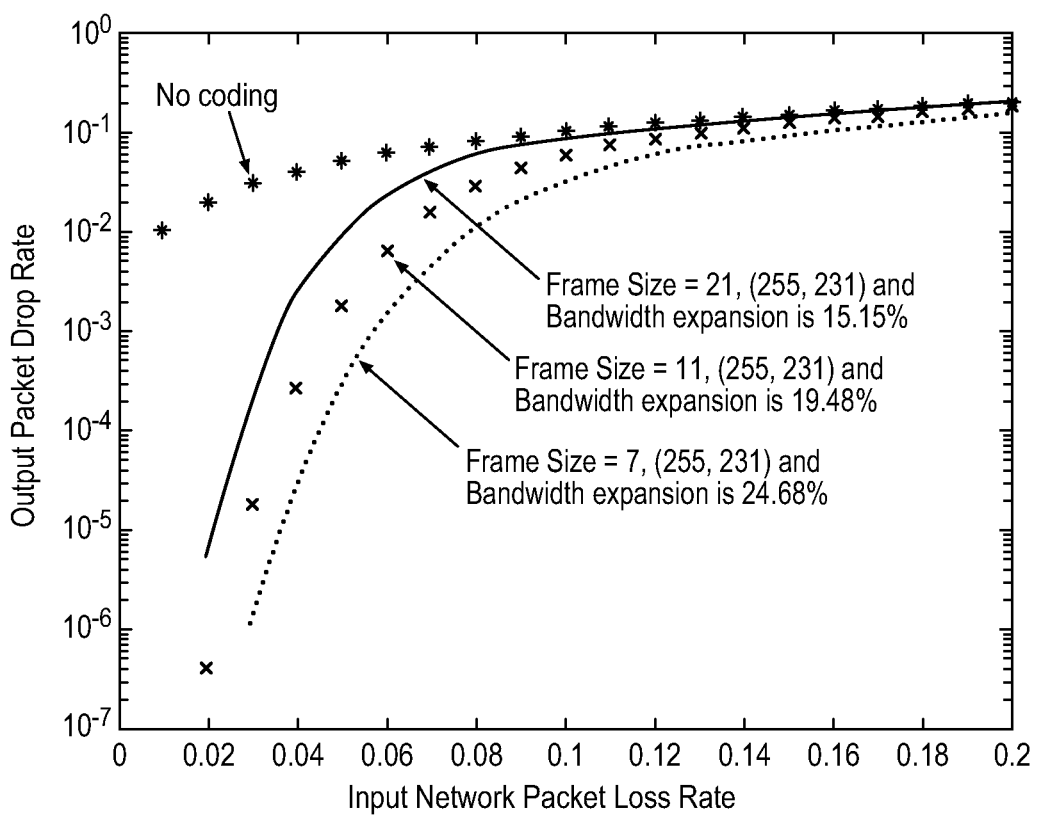
FIG. 11 illustrates simulation results for decoded packet loss rates for various codes of a second method of the present Universal Packet Loss Recovery System.

The decoded packet loss rate performance of Method 2 for a memoryless network packet loss model was simulated using a (255, 231) Reed Solomon code for the error correction code C(2) with a Berlekamp-Massey type of erasure decoding algorithm. The simulation results for several cases with frame sizes (n−1)=21, 11, and 7 are shown in FIG. 11. The bandwidth expansion factor of the (255, 231) Reed Solomon code C(2) is 10.39%. The bandwidth expansion factor for the Method 2 scheme using this (255,231) Reed Solomon code with frame sizes 21, 11, and 7 are 15.15%, 19.48%, and 24.68%, respectively. It is clear from the results in FIG. 10 that a range of decoded packet loss rate performances can be obtained using different frame sizes and, hence, different bandwidth expansion factors in this method.

The attractiveness of this method is that a single encoder and a single decoder is used for the error correction code C(2), and a common decoder for the single parity check code C(1) is used regardless of the frame sizes employed. An easily implementable Universal Packet Forward Error Correction Coding scheme is shown that allows adjustment of the decoded packet loss rate performance by using different bandwidth expansion factors. The resulting Packet Forward Error Correction Coding schemes then can be used to obtain corresponding Universal Packet Loss Recovery Systems. However, note from FIG. 8 that Method 1 using a (255, 213) Reed Solomon code for error correction code C (with a bandwidth expansion factor of 19.72%) will outperform Method 2 (with a bandwidth expansion factor of 19.48%) using a frame size of 11 and the (255, 231) Reed Solomon code for error correction code C(2). While Method 2 has the advantage of flexibility and implementation ease, it may not yield the best possible decoded packet loss rate performance.

Method 3: Rectangular Packet Array with Rows Encoded Using a Single Parity Check Code and Columns Encoded Using a Maximum Distance Separable Code The objective of this method is to utilize the symbol erasure correction codes C(1) and C(2) of Method 2 in a different packet processing and code interleaving architecture to obtain superior decoded packet loss rate performance using roughly the same bandwidth expansion factors. Moreover this improvement should be obtained without requiring substantially higher implementation complexity. This Method 3 uses a rectangular packet array architecture rather than the column array architectures used previously in Methods 1 and 2. In this rectangular transport packet array, encoding will be performed in two stages where a single parity check code C(1) is used to first encode the rows of packets to obtain a parity packet for each row. The Maximum Distance Separable code C(2) then is to be used in the second stage to encode the columns of the transport packet array. Decoding performance is enhanced in this product coding architecture of Method 3 by iterating the two decoding algorithms for the single parity check code C(1) and for the error correction code C(2) over the rows and the columns of the received packet array, respectively.

Figure 12:
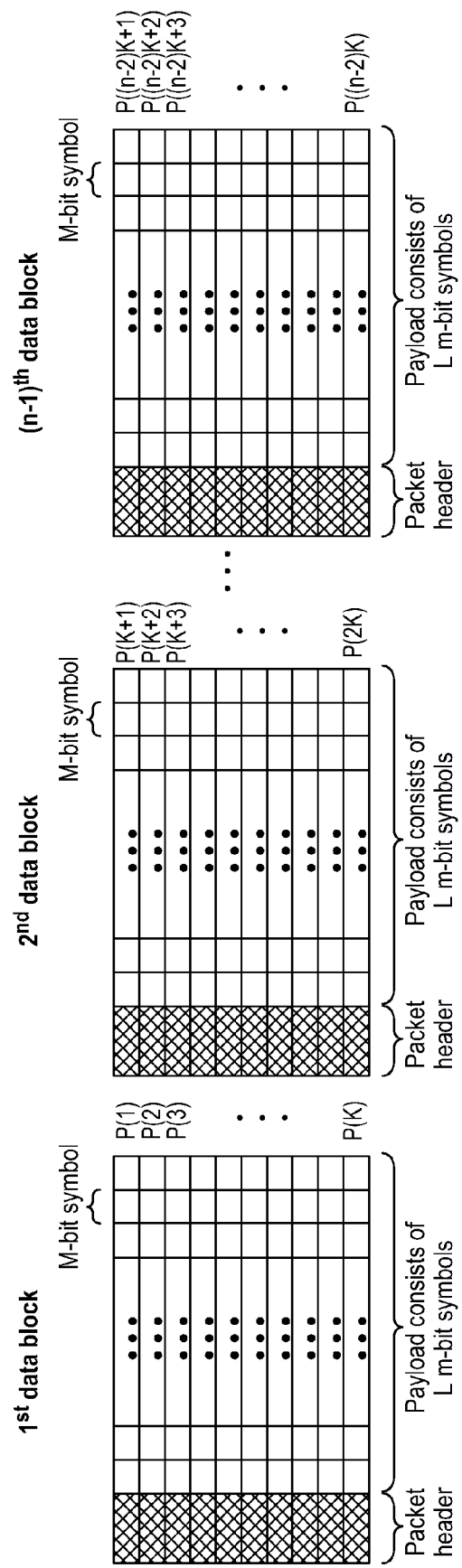
FIG. 12 illustrates the format of blocks of data packets arranged in sequence for a third method of the present Universal Packet Loss Recovery System.

Encoding consists of two stages. Incoming transport data packets for packet encoding are divided into (n−1) blocks, with each block consisting of K consecutive packets. The packets in the (n−1) blocks are stored in a buffer in the sequence shown in FIG. 12. Let P(i) denote the data payload for the i-th data packet.

Let Pj(i) denote the j-th GF(2m) symbol in the i-th transport data packet P(i). For $1 \leq k \leq n$, then, let the matrix, $$D(k) = \begin{bmatrix} P_1((k-1)K+1) & P_2((k-1)K+1) & \ldots & P_L((k-1)K+1) \\ P_1((k-1)K+2) & P_2((k-1)K+2) & \ldots & P_L((k-1)K+2) \\ P_1((k-1)K+3) & P_2((k-1)K+3) & \ldots & P_L((k-1)K+3) \\ \vdots & \vdots & & \vdots \\ P_1(kK) & P_2(kK) & \ldots & P_L(kK) \end{bmatrix},$$

represent the data payload area of the k-th block of K packets, where each row of D(k) forms a single packet.

Therefore, the matrix, $$M = [D(1)D(2) \ldots D(n-1)]$$

represents the data payload area of the (n−1) blocks of transport data packets, where each column of M consists of K symbols from the field GF($2^m$). That is, $$M = \begin{bmatrix} P_1(1) & P_2(1) & \ldots & P_L(1) & P_1(K+1) & P_2(K+1) & \ldots & P_L(K+1) & \cdots & P_1((n-2)K+1) & P_2((n-2)K+1) & \ldots & P_L((n-2)K+1) \\ P_1(2) & P_2(2) & \ldots & P_L(2) & P_1(K+2) & P_2(K+2) & \ldots & P_L(K+2) & \cdots & P_1((n-2)K+2) & P_2((n-2)K+2) & \ldots & P_L((n-2)K+2) \\ P_1(3) & P_2(3) & \ldots & P_L(3) & P_1(K+3) & P_2(K+3) & \ldots & P_L(K+3) & \cdots & P_1((n-2)K+3) & P_2((n-2)K+3) & \ldots & P_L((n-2)K+3) \\ \vdots & \vdots & & \vdots & \vdots & \vdots & & \vdots & & \vdots & \vdots & & \vdots \\ P_1(K) & P_2(K) & \ldots & P_L(K) & P_1(2K) & P_2(2K) & \ldots & P_L(2K) & \cdots & P_1((n-1)K) & P_2((n-1)K) & \ldots & P_L((n-1)K) \end{bmatrix}$$
$$\underbrace{\hphantom{P_1(1)\ P_2(1)\ \ldots\ P_L(1)}}_{D(1)} \quad \underbrace{\hphantom{P_1(K+1)\ P_2(K+1)\ \ldots\ P_L(K+1)}}_{D(2)} \quad \ldots \quad \underbrace{\hphantom{P_1((n-2)K+1)\ \ldots\ P_L((n-1)K)}}_{D((n-1))}$$

Let $q_i(l)$ be a vector consisting of the following (n−1) symbols from the field $GF(2^m)$:

$q_i(l) = [P_i(l)\ P_i(K+l)\ \ldots\ P_i((n-2)K+l)]$ for $1 \leq i \leq L$ and $1 \leq l \leq K$.

In the first encoding stage, each (n−1)-symbol vector $q_i(l)$ is encoded into a codeword in the single parity check code C(1) consisting of the (n−1) data symbols plus a parity symbol from GF(2m). This is illustrated in FIG. 13, where the dotted, dashed, and solid directional lines in this figure indicate different $q_i(l)$.

Figure 14:
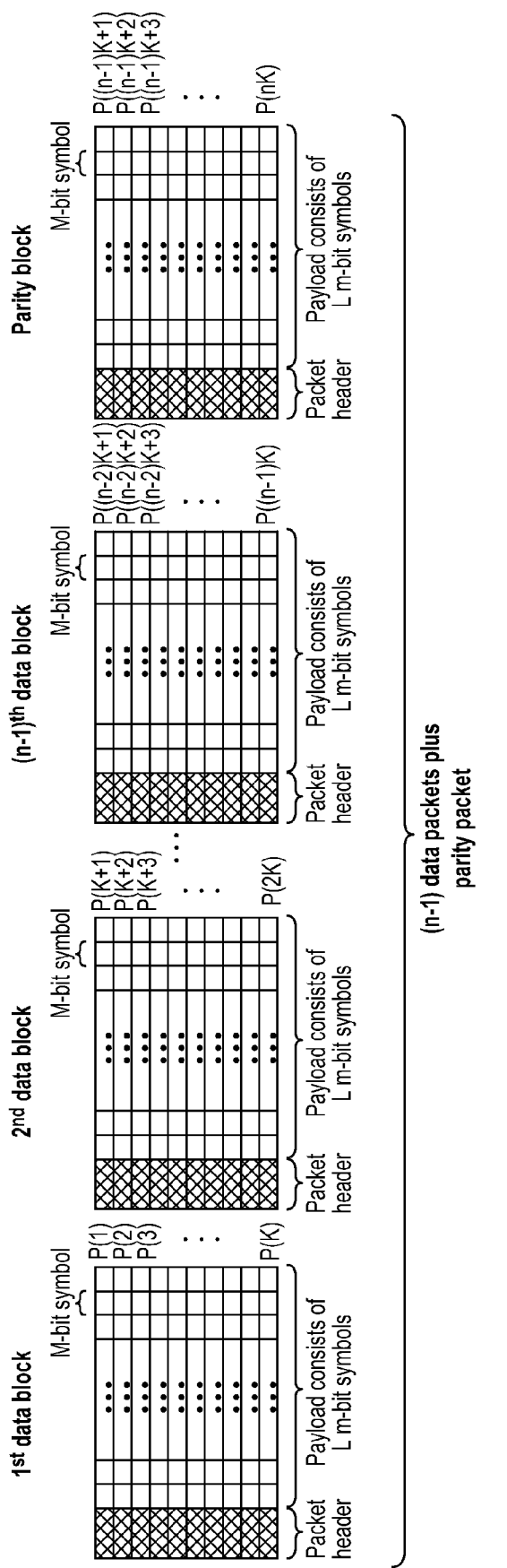
FIG. 14 illustrates the format of blocks of encoded data packets after the first stage of encoding using a third method of the present Universal Packet Loss Recovery System.

This encoding of each $q_i(l)$ with the (n, n−1) single parity check code C(1) results in K rows of L GF(2m) parity-check symbols, thereby resulting in K parity packets for the K rows in M. This then constitutes the first stage of encoding using the single parity check code C(1). After its completion, the buffer stores a K×nL encoded packet data payload array A over GF(2m) as shown in FIG. 14, which also includes the headers of each of the packets in A. Each column in the data payload areas of A consists of K symbols from GF(2m), and each row of A consists of nL symbols from GF(2m).

Figure 15:
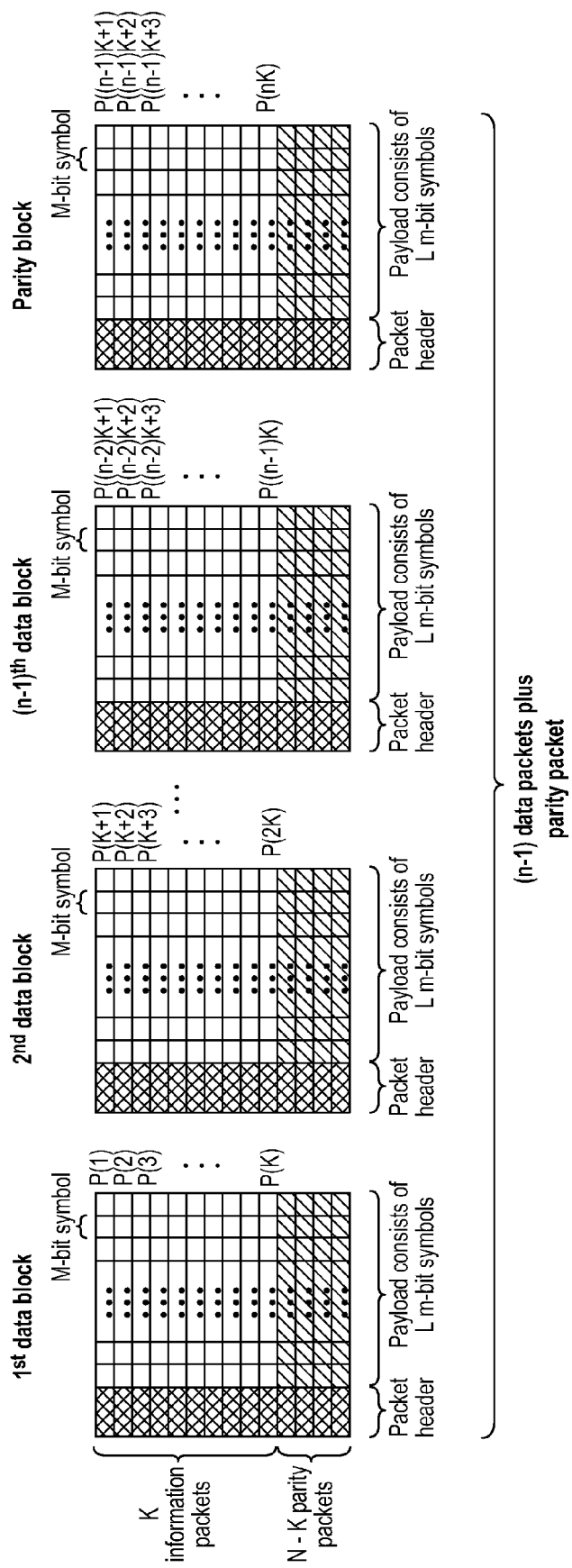
FIG. 15 illustrates the format of blocks of encoded data packets after the first and second stages of encoding using a third method of the present Universal Packet Loss Recovery System.

Note that the array A=[D(1) D(2) . . . D(n−1) Column of Parity Packets]. The second stage of encoding first operates on the columns in each of the subarrays D(i) in A. In this phase of encoding, the K GF(2m) symbols in each column of D(i) are encoded into a codeword using the error correction code C(2). Finally, each column of K GF(2m) symbols in the right-hand side column of parity packets in the array A also are encoded into a codeword using the error correction code C(2). This operation is identical to the encoding process employed in Method 1 using the error correction code C. Completion of this second stage of encoding results in an N×(n−1)L encoded packet data payload array Q over GF(2m). The last N−K rows of Q are parity packets obtained by the encoding process using the systematic error correction code C(2). The resulting encoded packet data payload array Q is shown in FIG. 15 after the completion of both stages. Note that FIG. 15 depicts the array Q along with the headers of each of the packets in Q.

The encoded packets then are transmitted a column at a time. In other words, the encoded packets are transmitted in the order of P(1), P(2), . . . , P(K) plus its associated (N−K) C(2) parity packets, then P(K+1), P(K+2), . . . , P(2K) plus its associated (N−K) C(2) parity packets, and so on, finishing with P((n−2)K+1), P((n−2)K+2), . . . , P((n−1)K) plus its associated (N−K) C(2) parity packets followed by the K parity packets generated by the single parity check code C(1) and its associated (N−K) C(2) parity packets.

The decoding procedure on the corresponding received array is an iterative process as follows:

Step 1: If the column of K received single parity check code C(1) parity blocks contains no lost packets, then discard its associated (N−K) parity packets and continue directly to Step 2. If the number of lost parity packets does not exceed the erasure correction capability of the decoding procedure for the error correction code C(2), then use the error correction code C(2) erasure decoding algorithm to recover all the lost parity packets, place all decoded erasure symbols back into the received array, and continue to Step 2. If the number of lost parity packets exceeds the erasure correction capability of the decoding procedure of the error correction code C(2), then go to Step 2 directly.

Step 2: Only the rows in the received packet array with a single lost packet are decoded using erasure decoding for the (n, n−1) single parity check code C(1) in this decoding step. This process is similar to the first decoding stage of Method 2 for each received frame. Place all decoded erasure symbols back into the received array. If all of the packets in the (n−1) blocks of decoded data packets are recovered in the first decoding step, then all of the data packets are delivered to the end user and the decoding process is completed. Otherwise, continue to Step 3.

Step 3: This decoding step addresses only those blocks with remaining lost packets after Step 2. Each of these blocks then is decoded using the erasure decoding algorithm of the error correction code C(2) on each of the data payload columns. This procedure is identical to that used in Method 1 for decoding the error correction code C. Place all decoded erasure symbols back into the received array. If all of the packets in the (n−1) blocks of decoded data packets are recovered in this decoding step, then all of the data packets are delivered to the end user and the decoding process is completed. Otherwise, continue to Step 4.

Step 4: If any lost packets are recovered in Step 3, then return to Step 2. Otherwise, the decoding process is complete. Deliver all decoded packets to the user.

A safety check can be imposed to make sure the maximum number of iterations does not exceed a preset number S. For example, if S is equal to 1, then no iterations will be performed. Computer simulations of this method indicate that satisfactory results can be obtained when S is either two or three.

Figure 16:
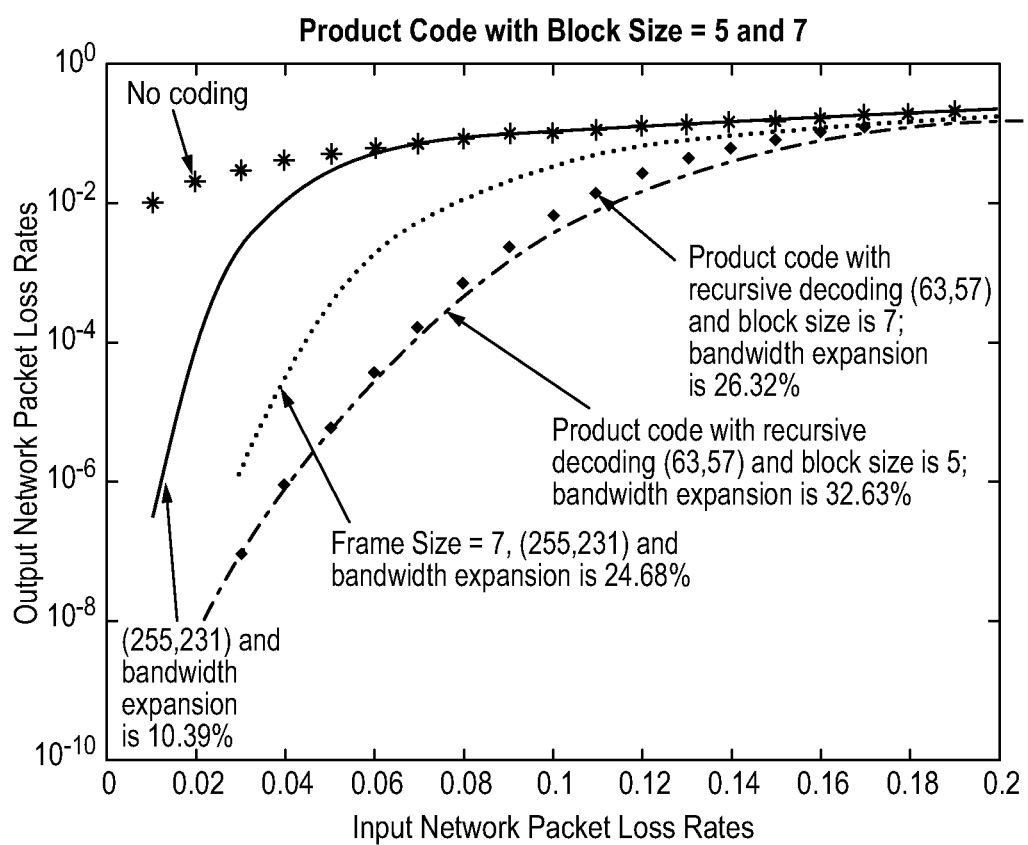
FIG. 16 illustrates simulation results for decoded packet loss rates for various codes of a third method of the present Universal Packet Loss Recovery System.

The decoded packet loss rate performance of Method 3 for a memoryless network packet loss model was simulated using a (63, 57) Reed Solomon code for error correction code C(2) with a Berlekamp-Massey erasure decoding algorithm. The simulation results for two cases with block sizes n=5 or 7 and respective bandwidth expansion factors of 32.63% and 26.32% are shown in FIG. 16. This was compared to the corresponding simulated decoded packet loss rate of Method 2 using a (255, 231) Reed Solomon code for error correction code C(2) again with the same decoding algorithm where a frame size (n−1)=7 was used to obtain a bandwidth expansion factor of 24.68%. Therefore, all of these cases have somewhat similar bandwidth expansion factors. These results show the superiority of the two Method 3 cases over the Method 2 case considered. However, this better decoded packet loss rate performance is obtained at a cost of somewhat higher implementation complexity and higher decoding latencies for the Method 3 cases.

Method 3 retains the implementation advantage enjoyed by Method 2 over Method 1. That is, it requires only a single encoder and a single decoder for the error correction code C(2) and a common encoder and decoder for the single parity check code C(1) regardless of the block sizes employed. Therefore, a Universal Packet Loss Recovery System based on Method 3 Packet Forward Error Correction Coding schemes has a significant implementation advantage.

Adaptation to Varying Input Network Packet Loss Rates

The three packet loss recovery methods described above have scalable packet loss recovery capabilities depending on the bandwidth expansion factors that are utilized. In certain applications, periodic reception quality reports on the raw end-to-end network packet loss conditions are sent back by each receiver to its sender. In these circumstances, the Universal Packet Loss Recovery schemes described above can be made adaptive to maintain a required decoded packet loss rate performance level in response to varying input network packet loss rates. That is, a sender may adjust the packet loss recovery capability in response to the input network packet loss rate reported by its receiver. In particular, a higher reported input network packet loss rate may be addressed at the sending end by increasing the packet loss recovery capability in each of the three methods described above to maintain a required decoded output packet loss rate. This is possible when Real Time Protocol (RTP) is used over Internet Protocol networks employing User Datagram Protocol (UDP) transport. Real Time Protocol supports error correction schemes and incorporates a control protocol called Real Time Control Protocol (RCTP) where Receiver Report (RR) packets are periodically sent by each receiver to its sender during a Real Time Protocol session. Receiver Report packets sent by each receiver includes the long-term cumulative packet loss count during a session and short-term network packet loss rate statistics between reports. Feedback of these input network packet loss statistics through these Receiver Report packets from each receiver to its sender allows the sender to adjust the packet loss recovery capability in each of the three methods described above in order to maintain a required decoded packet loss rate performance level. In each of the above described three Universal Packet Loss Recovery methods, the actual coding and interleaving frame parameters required for such an adjustment then can be transmitted from the sender to the receiver in an Application-Defined Real Time Control Protocol Packet (APP).

In Method 1, a higher input network packet loss rate can be addressed by reducing the Forward Error Correction Code rate K/N and thereby increasing the packet loss recovery capability, as well as the bandwidth expansion factor (N−K)/K. A relation between the decoded output Packet Loss Rate PLR and the input network packet loss rate $\epsilon$ (obtained from the Real Time Control Protocol Receiver Report packets sent by the receiver) for given values of K and N and decoding packet loss recovery capability $\rho$ ($\rho$=(N−K)/2 for (N, K) Reed Solomon codes using the Berlekamp-Massey erasure decoding algorithm) is useful for this purpose. In this invention we have derived the following upper bound PLRU on Packet Loss Rate:

$$PLR \leq PLR_u = \exp\{N[H(\rho/N) + (\rho/N)\log_e \epsilon + (1-\rho/N)\log_e(1-\epsilon)]\} \quad (1)$$

where $$H(\rho/N) = -(\rho/N)\log_e(\rho/N) - (1-\rho/N)\log_e(1-\rho/N). \quad (2)$$

In Method 1, $\rho$ and N can be selected for a given input network packet loss rate $\epsilon$ to achieve a desired decoded output packet loss rate given by PLRU above. The resulting adjusted parameters K and N then are transmitted from the sender to the receiver using an Application-Defined Real Time Control Protocol Packet (APP).

In Method 2, a simple formula similar to equation (1) is currently not directly available. Instead, simulated decoded output packet loss rate performance levels for various input packet loss rates similar to that contained in FIG. 11 will be used to determine the adjusted parameters: K, N, and frame size (n−1) for the new reported input network packet loss rate from the Real Time Control Protocol Receiver Report packet from the receiver. Again, these new adjusted parameters are transmitted from the sender to the receiver in an Application-Defined Real Time Control Protocol Packet (APP).

Finally, in Method 3, a simple formula similar to equation (1) is also currently not directly available. Simulated decoded output packet loss rate performance levels for various input packet loss rates similar to that contained in FIG. 16 will be used to determine the adjusted parameters: K, N, and block size (n−1) for the new reported input network packet loss rate from the Real Time Control Protocol Receiver Report packet from the receiver. These new adjusted parameters then are transmitted from the sender to the receiver in an Application-Defined Real Time Control Protocol Packet (APP).

SUMMARY

Several different Universal Packet Forward Error Correction Coding schemes have been invented and are designed for the recovery of lost packets encountered in the delivery of streaming multimedia packets over packet-switched networks. These methods are universal in the sense that they can be adjusted to yield different decoded packet loss rate performances and bandwidth expansion factors to suit different applications. Different approaches have been devised that are suitable for different requirements, depending on whether decoded packet loss rate performance, bandwidth efficiency, or implementation complexity are more important.

What is claimed as new and desired to be protected by Letters Patent of the United States is:

1. A method of Packet Forward Error Correction Coding, operable in a packet switching network that serves to transmit data packets from a source to a destination, for encoding a stream of data packets received from a source by including redundant codeword packets in the stream of data packets transmitted to said destination to allow for the recovery of corrupted data packets by the decoder of said Packet Forward Error Correction Coding scheme located at said destination, comprising:

storing a predetermined plurality of fixed length data packets, received from said source, as rows of an array;

subdividing said array of data packets into a plurality of sequential frames;

preprocessing each of the rows of all of said plurality of sequential frames with a single check parity code to create a single parity packet for each row of said plurality of sequential frames, for the purpose of correcting single packet losses that may appear in transmission of one of the row of frames in the packet array across said packet switching network;

storing the generated single parity packets in a frame appended to the array of data packets;

encoding each column of said array of data packets and said frame of parity packets with an error correction code to create at least two codeword packets which are used by said decoder of said Packet Forward Error Correction Coding scheme located at said destination to recover corrupted data packets of said array of data packets;

appending said at least two codeword packets created for each column to a corresponding column of the array of data packets and said appended parity frame;

transmitting said array of data packets, said frame of parity packets and said codeword packets to said destination via said packet switching network;

at the destination:

storing the received array of data packets, said frame of parity packets and said codeword packets;

inserting a null packet consisting of a row of empty slots when a lost packet is detected;

decoding the array of data packets column by column using an erasure decoding algorithm for said decoder of said Forward Error Correction Coding scheme; and discarding, if no errors occur, said at least two code word packets for each column that fails to contain lost packets.

2. The method of Packet Forward Error Correction Coding of claim 1 wherein said step of encoding comprises:

encoding each column of said array of data packets using a systematic Maximum Distance Separable code.

3. The method of Packet Forward Error Correction Coding of claim 1 wherein said step of encoding comprises:

encoding each column of said array of data packets using a systematic Maximum Distance Separable code.

4. The method of Packet Forward Error Correction Coding of claim 3 further comprising:

subdividing said received array of data packets at said destination into a plurality of frames;

representing a lost packet by a row of erasure symbols; and recovering the erased symbols in each received frame which contains only one lost packet using erasure decoding for the single parity check code.

5. The method of Packet Forward Error Correction Coding of claim 4 further comprising:

removing, if there are still rows of erasure symbols in the received frames, the rows of parity-check erasures in each received frame; and decoding the array of data packets column by column using the erasure decoding algorithm of the Maximum Distance Separable code.

6. The method of Packet Forward Error Correction Coding of claim 1 wherein said step of encoding each column comprises:

encoding each column of said array of said plurality of sequential frames and appended parity frame using a systematic Maximum Distance Separable code.

7. The method of Packet Forward Error Correction Coding of claim 1 further comprising:

recovering lost packets in each of said plurality of sequential frames of data packets received at said destination using said at least two codeword packets.

8. The method of Packet Forward Error Correction Coding of claim 7 further comprising:

recovering remaining lost packets in each of the rows of all of said plurality of sequential frames using said single parity packet for each row of said plurality of sequential frames.

9. The method of Packet Forward Error Correction Coding of claim 1 wherein said step of preprocessing comprises:

processing each of said plurality of frames with a linear block code to generate a single parity check symbol for each row of said plurality of sequential frames.

* * * * *